US010784613B2

(12) United States Patent
Ju et al.

(10) Patent No.: US 10,784,613 B2
(45) Date of Patent: Sep. 22, 2020

(54) ELECTRICAL CONNECTOR

(71) Applicant: LOTES CO., LTD, Keelung (TW)

(72) Inventors: Ted Ju, Keelung (TW); Chien Chih Ho, Keelung (TW)

(73) Assignee: LOTES CO., LTD, Keelung (TW)

( * ) Notice: Subject to any disclaimer, the term of this patent is extended or adjusted under 35 U.S.C. 154(b) by 260 days.

(21) Appl. No.: 16/036,077

(22) Filed: Jul. 16, 2018

(65) Prior Publication Data

US 2019/0199029 A1    Jun. 27, 2019

(30) Foreign Application Priority Data

Dec. 21, 2017   (CN) .......................... 2017 1 1391481

(51) Int. Cl.

| H01R 13/24 | (2006.01) |
|---|---|
| H01R 12/71 | (2011.01) |
| H01R 13/405 | (2006.01) |
| H01R 4/26 | (2006.01) |
| H01R 12/70 | (2011.01) |

(Continued)

(52) U.S. Cl.
CPC .............. *H01R 13/24* (2013.01); *H01R 4/26* (2013.01); *H01R 12/58* (2013.01); *H01R 12/7076* (2013.01); *H01R 12/716* (2013.01); *H01R 13/2435* (2013.01); *H01R 13/2442* (2013.01); *H01R 13/405* (2013.01); *H05K 3/3426* (2013.01); *H05K 3/3447* (2013.01); *H01R 4/02* (2013.01); *H01R 13/2485* (2013.01);

(Continued)

(58) Field of Classification Search
CPC .......... H01R 13/24; H01R 4/26; H01R 12/58; H01R 12/7076; H01R 12/716; H01R 13/2435; H01R 13/2442; H01R 13/405; H01R 4/02; H01R 13/2485
USPC .................... 439/626, 66, 816, 91, 591, 700
See application file for complete search history.

(56) References Cited

U.S. PATENT DOCUMENTS

| 4,892,492 A * | 1/1990 | Mueller ............... H01R 4/4818 439/78 |
|---|---|---|
| 6,155,845 A * | 12/2000 | Lin ........................ H01R 4/028 439/78 |

(Continued)

FOREIGN PATENT DOCUMENTS

| CN | 202503136 U | 10/2012 |
|---|---|---|
| CN | 101989698 B | 11/2012 |

*Primary Examiner* — Edwin A. Leon
(74) *Attorney, Agent, or Firm* — Locke Lord LLP; Tim Tingkang Xia, Esq.

(57) ABSTRACT

An electrical connector, used for electrically connecting a chip module to a circuit board, includes: an insulating body, provided with multiple accommodating grooves penetrating through the insulating body; and multiple conductive terminals, correspondingly accommodated in the accommodating grooves. Each conductive terminal includes a first terminal and a second terminal independently provided. The first terminal has a first connecting portion and an elastic arm, and the elastic arm has a contact portion to be in contact with the chip module. The second terminal has a second connecting portion and a conducting portion to be electrically connected with the circuit board. At least one fixing groove is provided on at least one of the first connecting portion and the second connecting portion, and the first terminal and the second terminal are mated and fixed along a vertical direction by the at least one fixing groove.

14 Claims, 9 Drawing Sheets

(51) Int. Cl.
*H01R 12/58* (2011.01)
*H05K 3/34* (2006.01)
*H01R 4/02* (2006.01)

(52) U.S. Cl.
CPC ............... *H05K 2201/1075* (2013.01); *H05K 2201/10984* (2013.01)

(56) References Cited

U.S. PATENT DOCUMENTS

| | | | | |
|---|---|---|---|---|
| 6,290,555 | B1 * | 9/2001 | Nubuyuki | H01R 4/028 439/876 |
| 6,875,025 | B2 * | 4/2005 | Hsu | H01R 13/112 439/140 |
| 6,908,328 | B2 * | 6/2005 | Lei | H01R 13/193 439/342 |
| 6,955,545 | B1 * | 10/2005 | Morana | H01R 13/112 439/83 |
| 7,001,190 | B2 * | 2/2006 | Morana | H01R 13/112 439/81 |
| 7,134,920 | B1 * | 11/2006 | Ju | H05K 7/1069 439/691 |
| 7,284,999 | B1 | 10/2007 | Ju | |
| 7,357,665 | B1 * | 4/2008 | Yan | H01R 13/2442 439/500 |
| 8,157,601 | B2 * | 4/2012 | Lin | H01R 13/2435 439/700 |
| 9,954,312 | B1 * | 4/2018 | Ju | H01R 12/707 |
| 10,148,023 | B1 * | 12/2018 | Ju | H01R 12/714 |
| 10,535,946 | B2 * | 1/2020 | Ho | H01R 12/7076 |

\* cited by examiner

ELECTRICAL CONNECTOR

CROSS-REFERENCE TO RELATED PATENT APPLICATION

This non-provisional application claims priority to and the benefit of, pursuant to 35 U.S.C. § 119(a), patent application Serial No. CN201711391481.3 filed in China on Dec. 21, 2017. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector, and more particularly to an electrical connector electrically connecting a chip module to a circuit board.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Currently, the operation speed of a chip module is getting faster and faster. A general electrical connector cannot meet the operation speed requirement of the chip module when transmitting signals, so that the signals being transmitted may generate error codes, causing failure in the normal information transmission. Terminals of the electrical connector are used for electrically connecting the chip module to a circuit board. In order to improve the speed of signal transmission and satisfy the requirement of miniaturization of the electrical connector, the existing terminals are getting smaller in thickness and volume, and the quantity of the terminals becomes greater, so that the assembly of the terminals becomes difficult, and interference more easily occur due to the dense terminals, thus resulting in poor high-frequency characteristics of the terminals and problems in signal transmission.

Therefore, a heretofore unaddressed need to design an improved electrical connector exists in the art to address the aforementioned deficiencies and inadequacies.

SUMMARY

In view of the above deficiencies in the background, the present invention is directed to an electrical connector which can be easily assembled and has good high-frequency characteristics by providing fixing grooves to connect separately arranged first terminals and second terminals.

To achieve the foregoing objective, the invention adopts the following technical solutions:

An electrical connector, configured to electrically connect a chip module to a circuit board, includes: an insulating body, provided with a plurality of accommodating grooves penetrating through the insulating body; and a plurality of conductive terminals, correspondingly accommodated in the accommodating grooves. Each of the conductive terminals includes a first terminal and a second terminal independently provided. The first terminal has a first connecting portion and an elastic arm, and the elastic arm has a contact portion configured to be in contact with the chip module. The second terminal has a second connecting portion and a conducting portion, and the conducting portion is configured to be electrically connected with the circuit board. At least one fixing groove is provided on at least one of the first connecting portion and the second connecting portion, and the first terminal and the second terminal are mated and fixed along a vertical direction by the at least one fixing groove.

In certain embodiments, the at least one fixing groove is formed on the first connecting portion, and the second connecting portion is located in the at least one fixing groove.

In certain embodiments, the first connecting portion is provided with a connecting sheet and at least one fixing portion formed by extending from a side edge of the connecting sheet, wherein the connecting sheet and the at least one fixing portion altogether define the at least one fixing groove, and the second connecting portion is located in the at least one fixing groove.

In certain embodiments, at least one side of the at least one fixing portion is provided with at least one extending portion to be connected with the connecting sheet, and the at least one extending portion is bent; and at least one rounding portion extends from at least one side of the second connecting portion correspondingly, and the at least one rounding portion matches with the at least one extending portion.

In certain embodiments, the first connecting portion is provided with a connecting sheet and two fixing portions formed by extending from two sides of the connecting sheet toward each other, free ends of the two fixing portions extend toward each other and are parallel to the connecting sheet, and the connecting sheet and the two fixing portions altogether define the at least one fixing groove and cover the second connecting portion.

In certain embodiments, the at least one fixing groove is formed on the second connecting portion, and the first connecting portion is located in the at least one fixing groove.

In certain embodiments, the second connecting portion is provided with a connecting sheet and at least one fixing portion formed by extending from a side edge of the connecting sheet, and the connecting sheet and the at least one fixing portion altogether define the at least one fixing groove and cover the first connecting portion.

In certain embodiments, at least one side of the at least one fixing portion is provided with at least one extending portion to be connected with the connecting sheet, and the at least one extending portion is bent; and at least one rounding portion extends from at least one side of the first connecting portion correspondingly, and the at least one rounding portion matches with the at least one extending portion.

In certain embodiments, the second connecting portion is provided with two fixing portions and a connecting sheet, free ends of the two fixing portions extend toward each other and are parallel to the connecting sheet, and the first connecting portion is located in the at least one fixing groove defined by the connecting sheet and the two fixing portions.

In certain embodiments, the first connecting portion and the second connecting portion are fixedly connected by laser welding or heat welding.

In certain embodiments, the at least one fixing groove includes at least one first fixing groove and at least one second fixing groove, the at least one first fixing groove is provided on the first connecting portion, and the at least one second fixing groove is provided on the second connecting portion; the at least one first fixing groove and the at least one second fixing groove are cross-embedded in a vertical direction; and the second connecting portion is located in the at least one first fixing groove, and the first connecting portion is located in the at least one second fixing groove.

In certain embodiments, the first connecting portion is provided with two first fixing portions located at two sides of the at least one first fixing groove; the second connecting portion is provided with two second fixing portions located at two sides of the at least one second fixing groove; the two second fixing portions are respectively located at two ends of the first connecting portion, and a free end of each of the two second fixing portions is higher than the at least one first fixing groove; and the two first fixing portions are located at two sides of the second connecting portion, and a free end of each of the two first fixing portions is lower than the at least one second fixing groove.

In certain embodiments, an elastic portion bends and extends downward from the second connecting portion, the elastic portion is connected with the second connecting portion and the conducting portion, and during mating of the first connecting portion and the second connecting portion, the elastic portion stops the first connecting portion from excessively moving.

In certain embodiments, during assembly of the conductive terminals into the accommodating grooves, the first terminals of the conductive terminals are located in the accommodating grooves, and the second terminals of the conductive terminals are located outside the accommodating grooves and mate upward with the first terminals.

Compared with the related art, certain embodiments of the present invention have the following beneficial effects: each conductive terminal includes a first terminal and a second terminal independently provided. The first terminal has a first connecting portion and an elastic arm, and the elastic arm has a contact portion configured to be in contact with the chip module. The second terminal has a second connecting portion and a conducting portion, and the conducting portion is configured to be electrically connected with the circuit board. At least one fixing groove is provided on at least one of the first connecting portion and the second connecting portion, and the first terminal and the second terminal are mated and fixed along a vertical direction by the at least one fixing groove. In other words, the first connecting portion is provided with the connecting sheet and the fixing portion, which altogether define the fixing groove, and the second connecting portion is located in the fixing groove; or the second connecting portion is provided with the connecting sheet and the fixing portion, which altogether define the fixing groove and cover the first connecting portion. The first connecting portion and the second connecting portion increase the volume of the conductive terminal, so as to increase a capacitance value of each conductive terminal, and reduce the interference between the conductive terminals. As a result, high-frequency characteristics of the conductive terminals are improved. Further, during assembly of the conductive terminals into the accommodating grooves, the first terminals of the conductive terminals are located in the accommodating grooves, and the second terminals of the conductive terminals are located outside the accommodating grooves and mate upward with the first terminals, thus reducing the assembly difficulty of the conductive terminals, and increasing the assembly accuracy of the conductive terminals.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
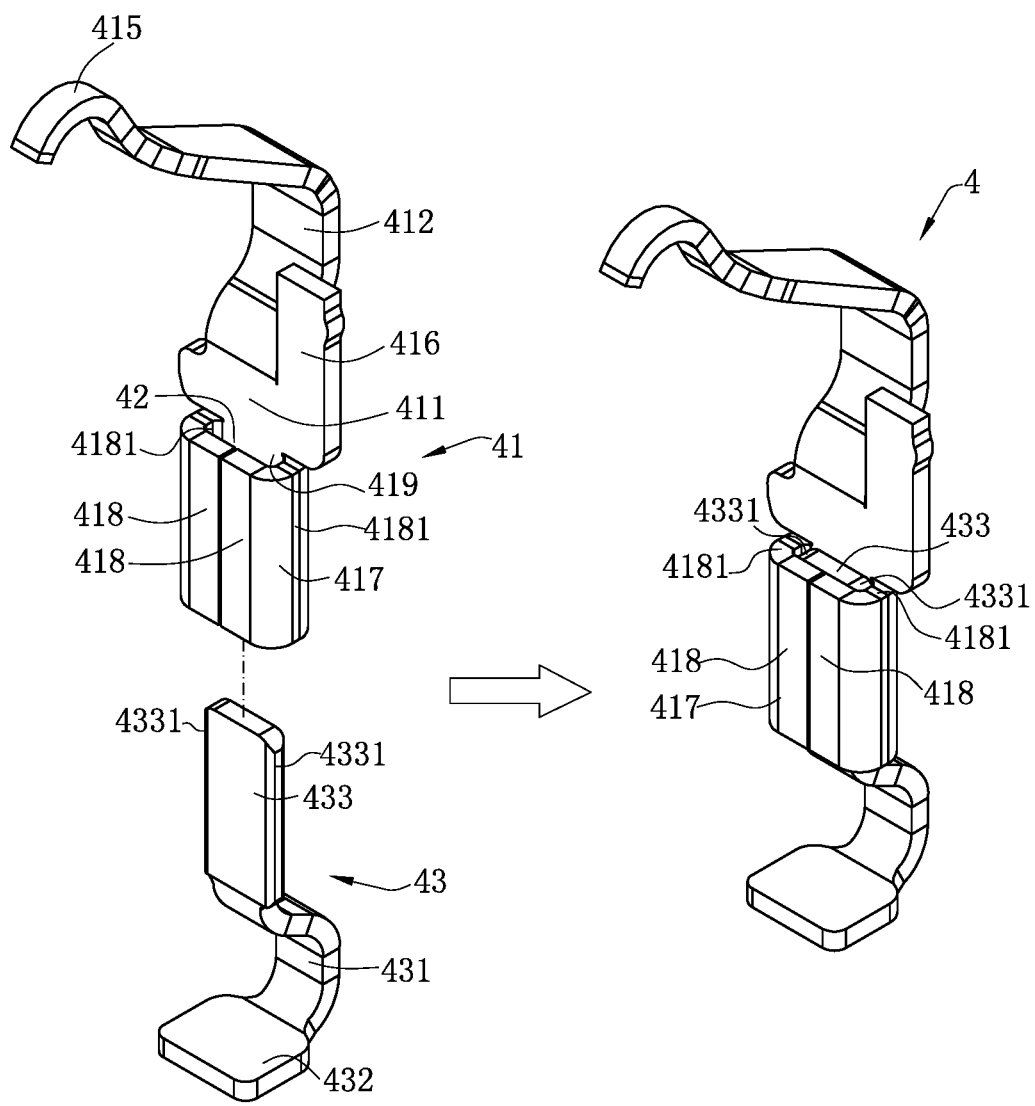
FIG. 1 is a schematic view of assembly of a first terminal and a second terminal of an electrical connector according to a first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-9. In accordance with the purposes of this invention, as embodied and broadly described herein, this invention, in one aspect, relates to an electrical connector.

Figure 2:
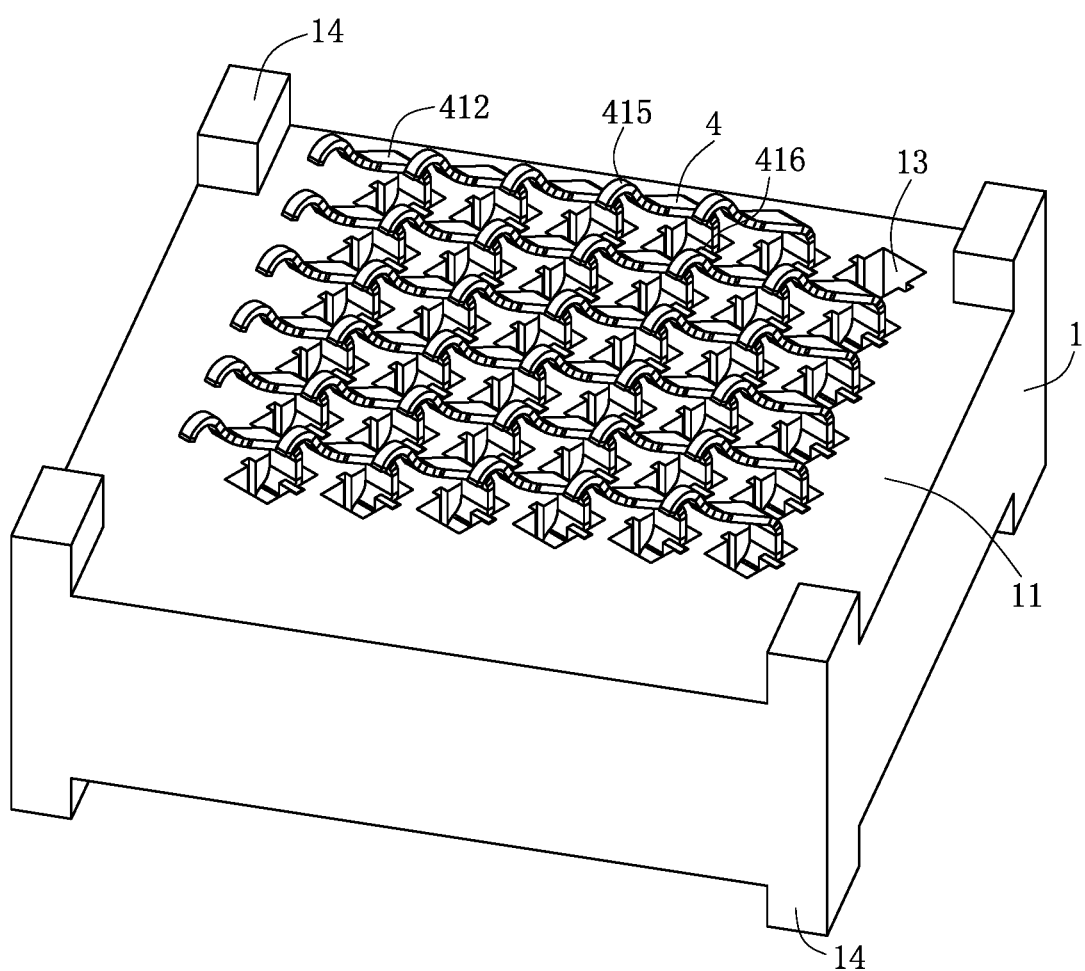
FIG. 2 is a perspective schematic view of the electrical connector according to the first embodiment of the present invention.
Figure 4:
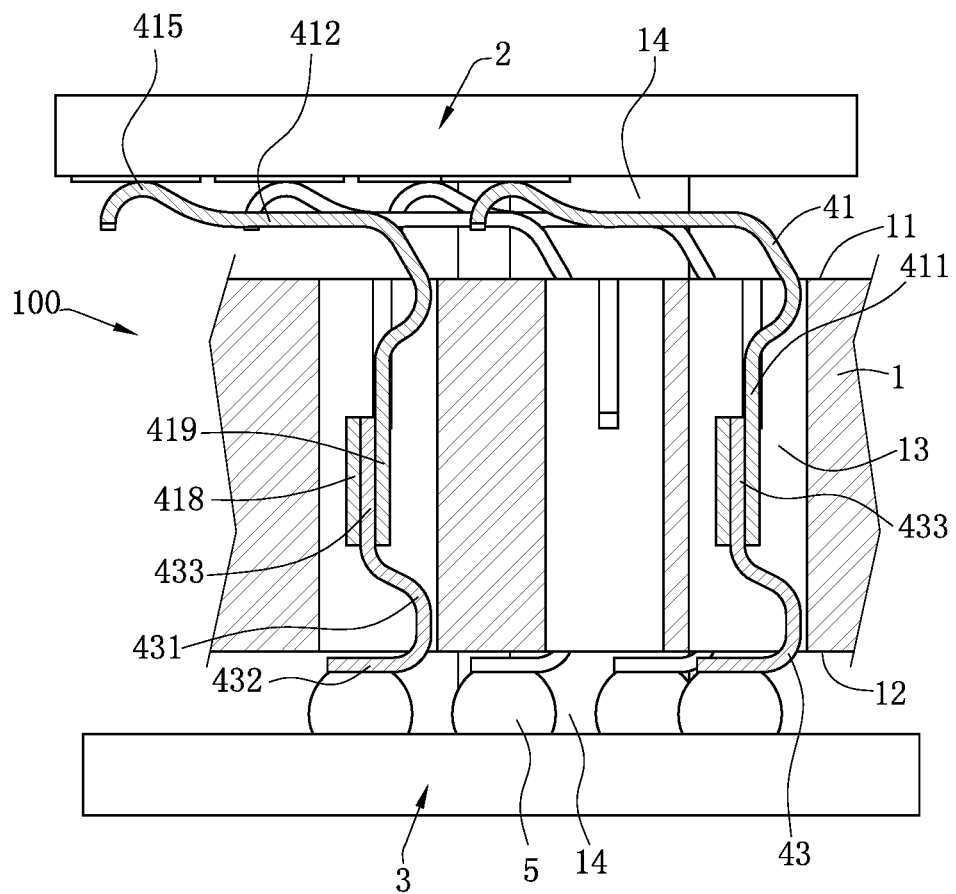
FIG. 4 is a sectional view of the electrical connector connecting a chip module and a circuit board according to the first embodiment of the present invention.

As shown in FIG. 2 and FIG. 4, an electrical connector 100 of the present invention is used for electrically connecting a chip module 2 to a circuit board 3, and includes an insulating body 1 and multiple conductive terminals 4.

Figure 6:
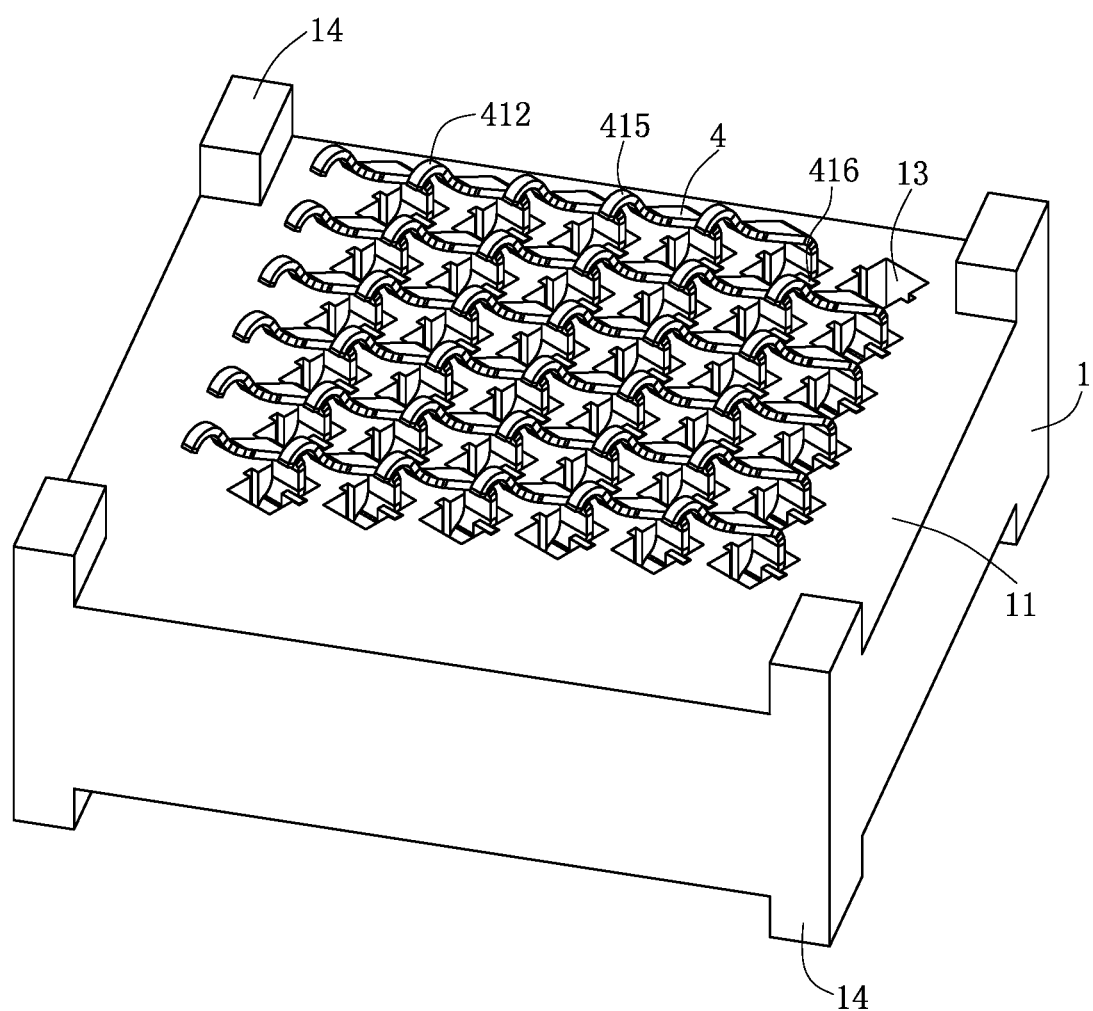
FIG. 6 is a perspective schematic view of the electrical connector according to the second embodiment of the present invention.
Figure 8:
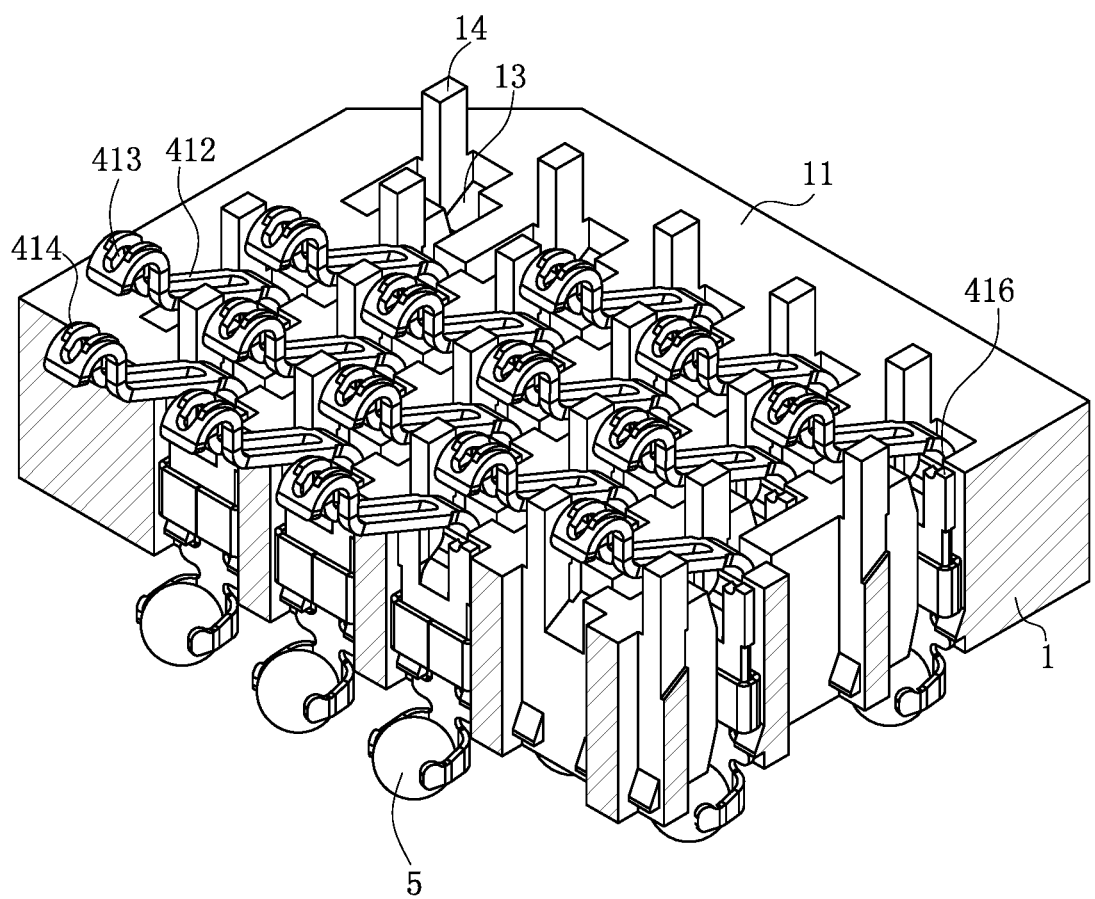
FIG. 8 is a perspective schematic view of the electrical connector according to the third embodiment of the present invention.

As shown in FIG. 4, FIG. 6 and FIG. 8, the insulating body 1 has an upper surface 11 and a lower surface 12 opposite to the upper surface 11. The insulating body 1 is provided with multiple accommodating grooves 13, and the accommodating grooves 13 penetrate through the upper surface 11 and the lower surface 12. The upper surface 11 is provided with multiple abutting blocks 14 for abutting the chip module 2, and the lower surface 12 is also provided with multiple abutting blocks 14 for abutting the circuit board 3.

Figure 3:
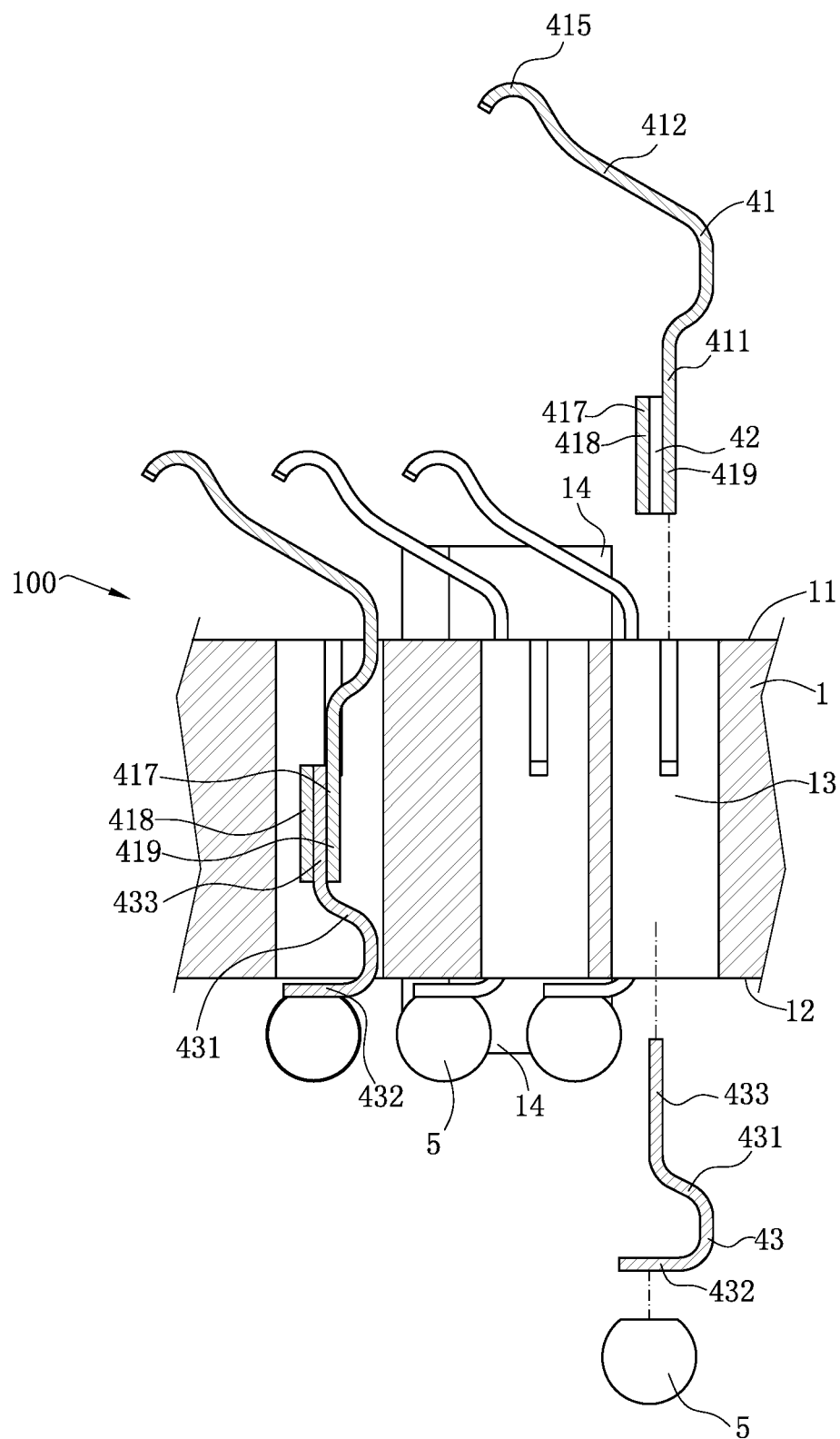
FIG. 3 is a sectional view of the electrical connector according to the first embodiment of the present invention.

FIG. 1, FIG. 3 and FIG. 4 show the electrical connector 100 according to a first embodiment of the present invention. Each of the conductive terminals 4 is correspondingly accommodated in one of the accommodating grooves 13. Each of the conductive terminals 4 includes a first terminal 41 and a second terminal 43, and the first terminal 41 and the second terminal 43 are independently provided, thus reducing the manufacturing difficulty of the conductive terminals 4. The first terminal 41 has a main body portion 411 and a first connecting portion 417 extending downward from the main body portion 411, as well as an elastic arm 412 and a strip connecting portion 416 extending upward from the main body portion 411. The elastic arm 412 has a contact portion 415, and the contact portion 415 is exposed from the upper surface 11 to be in contact with the chip module 2. The first connecting portion 417 is provided with a connecting sheet 419 and two fixing portions 418 formed by extending from two sides of the connecting sheet 419 toward each other. Free ends of the two fixing portions 418 extend toward each other and are parallel to the connecting sheet 419. Each of two sides of the two fixing portions 418 is provided with an extending portion 4181 to be connected with the connecting sheet 419. The extending portions 4181 are bent, and the connecting sheet 419 and the two fixing portions 418 altogether define a fixing groove 42. In other embodiments, one fixing portion 418 may be provided to extend from one side of the connecting sheet 419, and the fixing groove 42 is defined by the connecting sheet 419 and the one fixing portion 418. Alternatively, multiple fixing portions 418 may be provided to define the fixing groove 42 altogether with the connecting sheet 419.

As shown in FIG. 1, FIG. 3 and FIG. 4, the second terminal 43 has a second connecting portion 433 and a conducting portion 432. The conducting portion 432 is exposed from the lower surface 12 to be electrically connected with the circuit board 3, and each of the conducting portions 432 of the conductive terminals 4 is usually welded to the circuit board 3 by a solder 5. In certain embodiments, the conducting portion 432 may also be connected with the circuit board 3 through pressure. The second connecting portion 433 mates upward with the first connecting portion 417, and enters the fixing groove 42 to be covered in the fixing groove 42, so that the first terminal 41 and the second terminal 43 are mated and fixed in a vertical direction by the fixing groove 42. A rounding portion 4331 extends from each of two sides of the second connecting portion 433. The rounding portions 4331 and the extending portions 4181 match with each other so that the second connecting portion 433 can smoothly enter the fixing groove 42. In addition, to enhance a fixing effect, the first connecting portion 417 and the second connecting portion 433 are fixedly connected by laser welding. Certainly, the first connecting portion 417 and the second connecting portion 433 may be fixed by heat welding. The contact between the first connecting portion 417 and the second connecting portion 433 is surface contact, which facilitates the stable connection between the first terminal 41 and the second terminal 43. Each conductive terminal 4 has the first connecting portion 417 and the second connecting portion 433, so that the volume of the conductive terminals 4 increased, thus increasing a capacitance value of the conductive terminals 4, and reducing the interference between the conductive terminals 4. As a result, high-frequency characteristics of the conductive terminals 4 are improved, and signal transmission between the chip module 2 and the circuit board 3 is facilitated.

As shown in FIG. 1, FIG. 3 and FIG. 4, an elastic portion 431 bends and extends downward from the second connecting portion 433. The elastic portion 431 is connected with the second connecting portion 433 and the conducting portion 432. The bending directions of the elastic arm 412 and the elastic portion 431 are the same, thus reducing the diameter of the accommodating grooves 13, which facilitates the densification of the conductive terminals 4. During assembly of the conductive terminals 4 into the accommodating grooves 13, the first terminals 41 of the conductive terminals 4 are located in the accommodating grooves 13, and the second terminals 43 of the conductive terminals 4 are located outside the accommodating grooves 13 and mate upward with the first terminals 41 of the conductive terminals 4. For each of the conductive terminals 4, the second connecting portion 433 is assembled upward into the fixing groove 42, and the elastic portion 431 stops the first connecting portion 417 from excessively moving downward or the second connecting portion 433 from excessively moving upward. The first terminal 41 and the second terminal 43 are mated and fixed in the vertical direction by the fixing groove 42, so that the difficulty in assembling the conductive terminals 4 into the accommodating grooves 13 is reduced, and the assembly accuracy of the conductive terminals 4 is increased.

Figure 5:
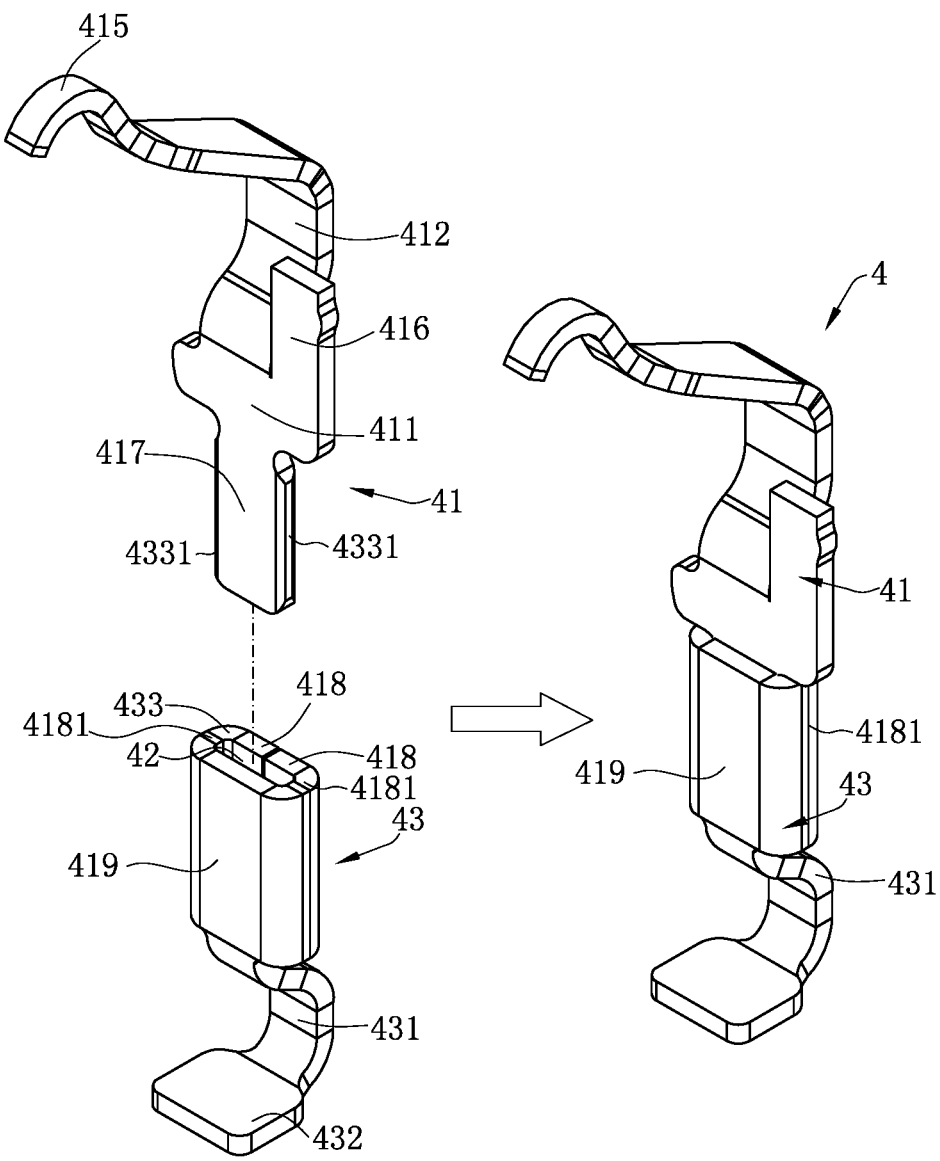
FIG. 5 is a schematic view of assembly of a first terminal and a second terminal of an electrical connector according to a second embodiment of the present invention.

FIG. 5 and FIG. 6 show the electrical connector 100 according to a second embodiment of the present invention. The second embodiment is different from the first embodiment in that: the rounding portions 4331 are provided on the first connecting portion 417; the fixing portion 418, the connecting sheet 419 and the fixing groove 42 are provided on the second connecting portion 433; and the fixing groove 42 covers the first connecting portion 417. During assembly of the conductive terminals 4 into the accommodating grooves 13, the first terminals 41 are located in the accommodating grooves 13, and the second terminals 43 are located outside the accommodating grooves 13 and mate upward with the first terminals 41. For each of the conductive terminals 4, the fixing groove 42 mate upward with the first connecting portion 417, so that the first connecting portion 417 is covered in the fixing groove 42.

Figure 7:
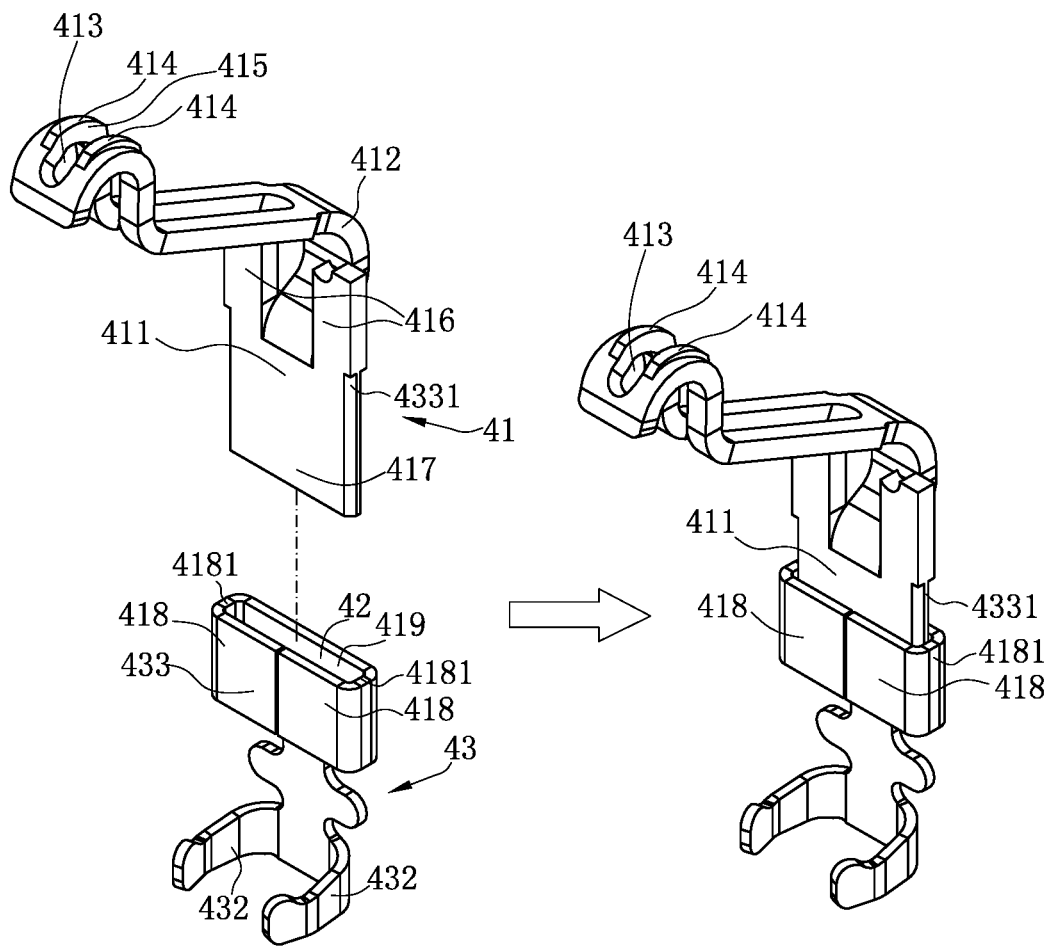
FIG. 7 is a schematic view of assembly of a first terminal and a second terminal of an electrical connector according to a third embodiment of the present invention.

FIG. 7 and FIG. 8 show the electrical connector 100 according to a third embodiment of the present invention. Specifically, the electrical connector 100 in the third embodiment, which is similar to those in the first and the second embodiment, is used for electrically connecting the chip module 2 to the circuit board 3 (as shown in FIG. 4). In this embodiment, a through hole 413 is formed in the elastic arm 412, and the through hole 413 extends to the contact portion 415. The through hole 413 increases the air flow space in the corresponding accommodating groove 13, which facilitates heat dissipation of the chip module 2 and the conductive terminals 4. At least one protruding portion 414 protrudes upward from the contact portion 415 to abut the chip module 2. Compared with the case where the contact portion 415 is in direct contact with the chip module 2, heat transferred from the chip module 2 to the conductive terminals 4 can be reduced using the protruding portion 414 to be in contact with the chip module 2.

Figure 9:
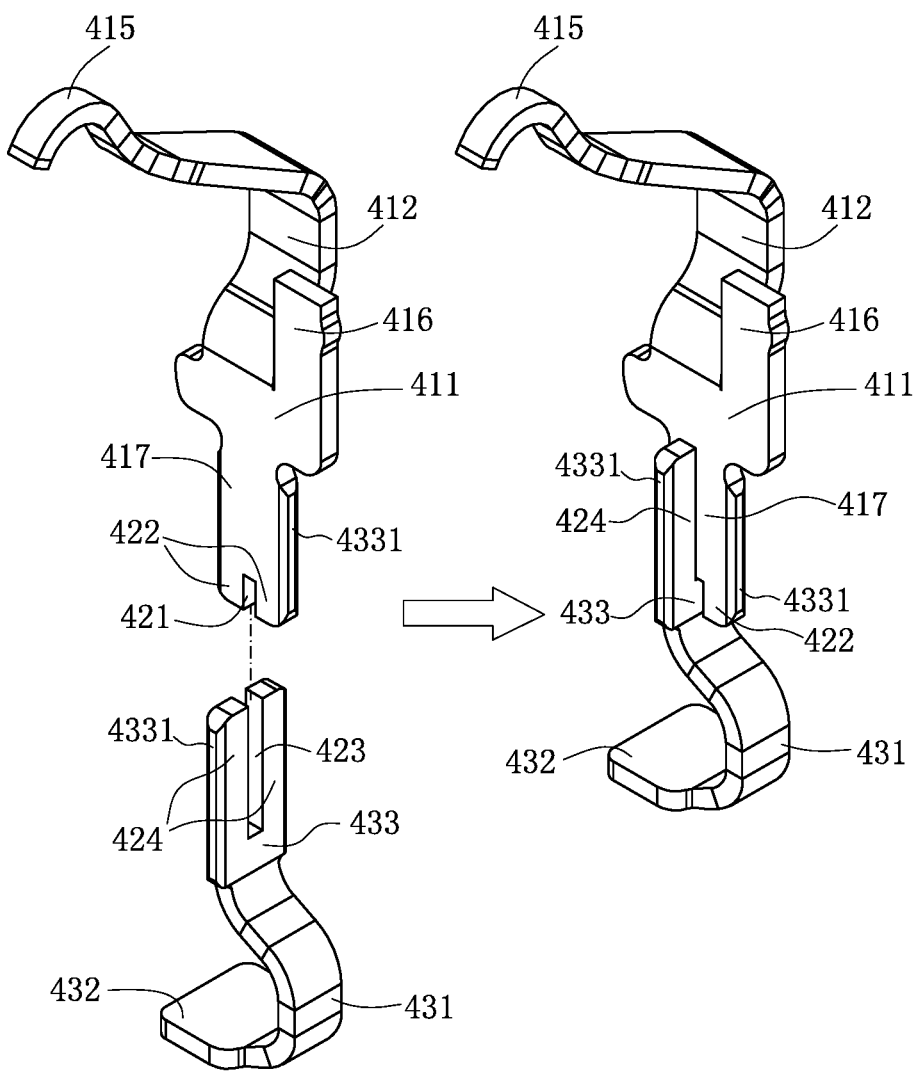
FIG. 9 is a schematic view of assembly of a first terminal and a second terminal of an electrical connector according to a fourth embodiment of the present invention.

FIG. 9 shows the electrical connector 100 according to a fourth embodiment of the present invention. In this embodiment, the fixing grooves 42 include at least one first fixing groove 421 and at least one second fixing groove 423. Each first fixing groove 421 is formed in the first connecting portion 417, and each second fixing groove 423 is formed in the second connecting portion 433. The first connecting portion 417 is provided with two first fixing portions 422 located on two sides of the first fixing groove 421, and the second connecting portion 433 is provided with two second fixing portions 424 located on two sides of the second fixing groove 423. The first fixing groove 421 and the second fixing groove 423 are cross-embedded in a vertical direction. The second connecting portion 433 is located in the first fixing groove 421. The two second fixing portions 424 are located at two ends of the first connecting portion 417 respectively, and a free end of each second fixing portion 424 is higher than the first fixing groove 421. The first connecting portion 417 is located in the second fixing groove 423. The two first fixing portions 422 are located at two sides of the second connecting portion 433, and a free end of each first fixing portion 422 is lower than the second fixing groove 423. The first connecting portion 417 and the second connecting portion 433 are cross-embedded by the first fixing groove 421 and the second fixing groove 423, so that it is difficult for the first connecting portion 417 and the second connecting portion 433 to separate from each other, thus improving the fixing effect of the first terminal 41 and the second terminal 43. In other words, the two corresponding fixing grooves 42 are cross-embedded in the vertical direction, so that the first connecting portion 417 and the second connecting portion 433 are fixed together.

To sum up, the electrical connector 100 according to certain embodiments of the present invention has the following beneficial effects:

(1) Each conductive terminal 4 has the first connecting portion 417 and the second connecting portion 433, so that the volume of the conductive terminals 4 increased, thus increasing a capacitance value of the conductive terminals 4, and reducing the interference between the conductive terminals 4. As a result, high-frequency characteristics of the conductive terminals 4 are improved, and signal transmission between the chip module 2 and the circuit board 3 is facilitated.

(2) During assembly of the conductive terminals 4 into the accommodating grooves 13, the first terminals 41 of the conductive terminals 4 are located in the accommodating grooves 13, and the second terminals 43 of the conductive terminals 4 are located outside the accommodating grooves 13 and mate upward with the first terminals 41 of the conductive terminals 4. For each of the conductive terminals 4, the second connecting portion 433 is assembled upward into the fixing groove 42, and the elastic portion 431 stops the first connecting portion 417 from excessively moving downward or the second connecting portion 433 from excessively moving upward. The first terminal 41 and the second terminal 43 are mated and fixed in the vertical direction by the fixing groove 42, so that the difficulty in assembling the conductive terminals 4 into the accommodating grooves 13 is reduced, and the assembly accuracy of the conductive terminals 4 is increased.

(3) A through hole 413 is formed in the elastic arm 412, and the through hole 413 extends to the contact portion 415. The through hole 413 increases the air flow space in the corresponding accommodating groove 13, which facilitates heat dissipation of the chip module 2 and the conductive terminals 4. At least one protruding portion 414 protrudes upward from the contact portion 415 to abut the chip module 2. Compared with the case where the contact portion 415 is in direct contact with the chip module 2, heat transferred from the chip module 2 to the conductive terminals 4 can be reduced using the protruding portion 414 to be in contact with the chip module 2.

(4) The first fixing groove 421 and the second fixing groove 423 are cross-embedded in a vertical direction. The second connecting portion 433 is located in the first fixing groove 421. The two second fixing portions 424 are located at two ends of the first connecting portion 417 respectively, and a free end of each second fixing portion 424 is higher than the first fixing groove 421. The first connecting portion 417 is located in the second fixing groove 423. The two first fixing portions 422 are located at two sides of the second connecting portion 433, and a free end of each first fixing portion 422 is lower than the second fixing groove 423. The first connecting portion 417 and the second connecting portion 433 are cross-embedded by the first fixing groove 421 and the second fixing groove 423, so that it is difficult for the first connecting portion 417 and the second connecting portion 433 to separate from each other, thus improving the fixing effect of the first terminal 41 and the second terminal 43.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, configured to electrically connect a chip module to a circuit board, comprising:
   an insulating body, provided with a plurality of accommodating grooves penetrating through the insulating body; and
   a plurality of conductive terminals, correspondingly accommodated in the accommodating grooves, each of the conductive terminals comprising a first terminal and a second terminal independently provided, wherein:
   the first terminal has a first connecting portion and an elastic arm, and the elastic arm has a contact portion configured to be in contact with the chip module;
   the second terminal has a second connecting portion and a conducting portion, and the conducting portion is configured to be electrically connected with the circuit board;
   at least one fixing groove is provided on at least one of the first connecting portion and the second connecting portion, and the first terminal and the second terminal are mated and fixed along a vertical direction by the at least one fixing groove; and
   the first connecting portion is provided with a connecting sheet and two fixing portions formed by extending from two sides of the connecting sheet toward each other, free ends of the two fixing portions extend toward each other and are parallel to the connecting sheet, and the connecting sheet and the two fixing portions altogether define the at least one fixing groove and cover the second connecting portion.

2. The electrical connector according to claim 1, wherein:
   at least one side of at least one of the two fixing portions is provided with at least one extending portion to be connected with the connecting sheet, and the at least one extending portion is bent; and
   at least one rounding portion extends from at least one side of the second connecting portion correspondingly, and the at least one rounding portion matches with the at least one extending portion.

3. An electrical connector, configured to electrically connect a chip module to a circuit board, comprising:
   an insulating body, provided with a plurality of accommodating grooves penetrating through the insulating body; and
   a plurality of conductive terminals, correspondingly accommodated in the accommodating grooves, each of the conductive terminals comprising a first terminal and a second terminal independently provided, wherein:
   the first terminal has a first connecting portion and an elastic arm, and the elastic arm has a contact portion configured to be in contact with the chip module;
   the second terminal has a second connecting portion and a conducting portion, and the conducting portion is configured to be electrically connected with the circuit board;
   at least one fixing groove is provided on at least one of the first connecting portion and the second connecting portion, and the first terminal and the second terminal are mated and fixed along a vertical direction by the at least one fixing groove; and
   the second connecting portion is provided with a connecting sheet and at least one fixing portion formed by extending from a side edge of the connecting sheet, and the connecting sheet and the at least one fixing portion altogether define the at least one fixing groove and cover the first connecting portion.

4. The electrical connector according to claim 3, wherein:
   at least one side of the at least one fixing portion is provided with at least one extending portion to be connected with the connecting sheet, and the at least one extending portion is bent; and
   at least one rounding portion extends from at least one side of the first connecting portion correspondingly, and the at least one rounding portion matches with the at least one extending portion.

5. The electrical connector according to claim 3, wherein the second connecting portion is provided with two fixing portions and a connecting sheet, free ends of the two fixing portions extend toward each other and are parallel to the connecting sheet, and the first connecting portion is located in the at least one fixing groove defined by the connecting sheet and the two fixing portions.

6. The electrical connector according to claim 1, wherein the first connecting portion and the second connecting portion are fixedly connected by laser welding or heat welding.

7. An electrical connector, configured to electrically connect a chip module to a circuit board, comprising:
   an insulating body, provided with a plurality of accommodating grooves penetrating through the insulating body; and
   a plurality of conductive terminals, correspondingly accommodated in the accommodating grooves, each of the conductive terminals comprising a first terminal and a second terminal independently provided, wherein:
   the first terminal has a first connecting portion and an elastic arm, and the elastic arm has a contact portion configured to be in contact with the chip module;
   the second terminal has a second connecting portion and a conducting portion, and the conducting portion is configured to be electrically connected with the circuit board;
   at least one fixing groove is provided on at least one of the first connecting portion and the second connecting portion, and the first terminal and the second terminal are mated and fixed along a vertical direction by the at least one fixing groove;
   the at least one fixing groove comprises at least one first fixing groove and at least one second fixing groove, the at least one first fixing groove is provided on the first connecting portion, and the at least one second fixing groove is provided on the second connecting portion;

the at least one first fixing groove and the at least one second fixing groove are cross-embedded in a vertical direction; and the second connecting portion is located in the at least one first fixing groove, and the first connecting portion is located in the at least one second fixing groove.

8. The electrical connector according to claim 7, wherein:

the first connecting portion is provided with two first fixing portions located at two sides of the at least one first fixing groove;

the second connecting portion is provided with two second fixing portions located at two sides of the at least one second fixing groove;

the two second fixing portions are respectively located at two ends of the first connecting portion, and a free end of each of the two second fixing portions is higher than the at least one first fixing groove; and the two first fixing portions are located at two sides of the second connecting portion, and a free end of each of the two first fixing portions is lower than the at least one second fixing groove.

9. The electrical connector according to claim 1, wherein an elastic portion bends and extends downward from the second connecting portion, the elastic portion is connected with the second connecting portion and the conducting portion, and during mating of the first connecting portion and the second connecting portion, the elastic portion stops the first connecting portion from excessively moving.

10. The electrical connector according to claim 1, wherein during assembly of the conductive terminals into the accommodating grooves, the first terminals of the conductive terminals are located in the accommodating grooves, and the second terminals of the conductive terminals are located outside the accommodating grooves and mate upward with the first terminals.

11. The electrical connector according to claim 3, wherein the first connecting portion and the second connecting portion are fixedly connected by laser welding or heat welding.

12. The electrical connector according to claim 3, wherein an elastic portion bends and extends downward from the second connecting portion, the elastic portion is connected with the second connecting portion and the conducting portion, and during mating of the first connecting portion and the second connecting portion, the elastic portion stops the first connecting portion from excessively moving.

13. The electrical connector according to claim 3, wherein during assembly of the conductive terminals into the accommodating grooves, the first terminals of the conductive terminals are located in the accommodating grooves, and the second terminals of the conductive terminals are located outside the accommodating grooves and mate upward with the first terminals.

14. The electrical connector according to claim 7, wherein during assembly of the conductive terminals into the accommodating grooves, the first terminals of the conductive terminals are located in the accommodating grooves, and the second terminals of the conductive terminals are located outside the accommodating grooves and mate upward with the first terminals.

* * * * *